(12) United States Patent  
Fregeau et al.

(10) Patent No.: US 8,471,575 B2  
(45) Date of Patent: Jun. 25, 2013

(54) METHODOLOGIES AND TEST CONFIGURATIONS FOR TESTING THERMAL INTERFACE MATERIALS

(75) Inventors: Dustin Fregeau, South Burlington, VT (US); David L. Gardell, Fairfax, VT (US); Laura L. Kosbar, Mohegan Lake, NY (US); Keith C. Stevens, Fairfield, VT (US); Grant W. Wagner, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 12/771,138

(22) Filed: Apr. 30, 2010

(65) Prior Publication Data

US 2011/0267082 A1    Nov. 3, 2011

(51) Int. Cl.
*G01R 31/00* (2006.01)

(52) U.S. Cl.
USPC ............ 324/750.03; 324/750.04; 324/750.06; 324/750.09; 702/130

(58) Field of Classification Search
USPC .. 324/750.03–750.09, 750.3, 750.28; 374/29, 374/30, 43–44, 137, 166, 141, 4, 5, 57
See application file for complete search history.

(56) References Cited

U.S. PATENT DOCUMENTS

| | | | |
|---|---|---|---|
| 5,088,006 A | 2/1992 | del Puerto et al. | |
| 5,918,665 A | 7/1999 | Babcock et al. | |
| 6,797,382 B2 | 9/2004 | Nguyen et al. | |
| 7,259,580 B2 | 8/2007 | Aube et al. | |
| 2005/0218471 A1* | 10/2005 | Ohkubo et al. | 257/467 |
| 2006/0090881 A1 | 5/2006 | Tuma | |
| 2007/0051773 A1 | 3/2007 | Ruchert et al. | |
| 2007/0161521 A1 | 7/2007 | Sachdev et al. | |
| 2008/0298016 A1 | 12/2008 | Karidis et al. | |
| 2009/0098666 A1* | 4/2009 | Hering et al. | 438/15 |
| 2009/0281254 A1 | 11/2009 | Bertrand et al. | |
| 2010/0006255 A1 | 1/2010 | Bilodeau | |
| 2010/0042355 A1* | 2/2010 | Aube et al. | 702/130 |

OTHER PUBLICATIONS

A.A. Mills et al., "Rate of evaporation of hydrocarbons from a hot surface: Nukiyama and Leidenfrost temperatures," Eur. J. Phys. vol. 3., 1982, pp. 152-154.

* cited by examiner

*Primary Examiner* — Jermele M Hollington  
*Assistant Examiner* — Son Le  
(74) *Attorney, Agent, or Firm* — Matthew C. Zehrer; Roberts Mlotkowski Safran & Cole, P.C.

(57) ABSTRACT

Methodologies and test configurations are provided for testing thermal interface materials and, in particular, methodologies and test configurations are provided for testing thermal interface materials used for testing integrated circuits. A test methodology includes applying a thermal interface material on a device under test. The test methodology further includes monitoring the device under test with a plurality of temperature sensors. The test methodology further includes determining whether any of the plurality of temperature sensors increases above a steady state.

15 Claims, 15 Drawing Sheets

METHODOLOGIES AND TEST CONFIGURATIONS FOR TESTING THERMAL INTERFACE MATERIALS

FIELD OF THE INVENTION

The invention relates to methodologies and test configurations for testing thermal interface materials and, in particular, to methodologies and test configurations for testing thermal interface materials used for testing integrated circuits.

BACKGROUND

The high cost associated with manufacturing integrated circuits dictates that defective devices be diagnosed as early as possible in the manufacturing process. For this reason, it is highly advantageous to test integrated circuit devices at the wafer level before further processing and packaging. For testing, the wafers are clamped to a wafer chuck and brought into contact with highly sophisticated probes. Once probe contact is made, the circuits are tested for both functionality and power integrity. However, circuits can be tested at power levels in excess of 400 watts, which consequently generates a tremendous amount of heat build-up in the chips which must be removed by the massive wafer chuck.

After wafer test, the wafers are diced into individual devices also known as chips. The good devices are mounted onto substrates to create modules. The modules then go through additional testing that may include burn in and re-test. The test equipment typically includes a high performance heat sink, test socket and tester electronics. The module is installed in the socket, the heat sink is brought into contact with the chip, the chip is tested, the heat sink is removed and the module is removed from the socket and sorted based on functionality. Some or all of these steps are commonly automated.

In some applications, a Liquid Thermal Interface (LTI) is placed between the chip and heat sink in order to improve thermal contact. There are many different types of LTIs that can be used to improve the thermal contact such as, for example, a mixture of water and other additives (i.e., Propylene Glycol (PG)). Water has excellent thermal performance but at high test temperatures may evaporate before the end of test. Also, water and other substances such as, for example, PG, can corrode the C4 connects. The corrosion or evaporation often happens only on small areas of the device and only on a small number of the total devices tested in a high volume manufacturing environment.

Alternate interface materials can have other disadvantages. Helium is clean and non-corrosive but thermal performance is insufficient. PAO (Poly Alpha Olefin) oil and various types of thermal grease have thermal performance almost as good as water but require cleaning with a solvent after test. Thermal pads have insufficient thermal performance and often leave a residue. Fluorinated fluids may be non-corrosive and clean but have poor thermal performance due to their low thermal conductivity. Liquid metals and soft metals can have very good thermal performance but can oxidize (degrade) over time and repeated reuse, they can damage the heat sinks and can have unreliable thermal contact to the chip. Greases, phase change materials and adhesives can make it difficult to separate the heat sink from the chip after test and leave a residue.

If faults stemming from the improper use of LTI are found after production has started it may be necessary to recall product and develop a new LTI resulting in significant production delays. Thus there is a need for improved methods of evaluating LTI fluids to ensure they will provide reliable service. Accordingly, there exists a need in the art to overcome the deficiencies and limitations described hereinabove.

SUMMARY

In a first aspect of the invention, a test methodology comprises applying a thermal interface material between a device and heat sink. Power is applied to the test device. The test methodology further comprises monitoring the device with a plurality of temperature sensors. The test methodology further comprises determining whether any of the plurality of temperature sensors increase above a steady state temperature.

In another aspect of the invention, a test methodology comprises measuring conductivity between two interconnects by applying a voltage between the two interconnects. The test methodology further comprises applying a thermal interface material in contact with at least two interconnects. The test methodology further comprises determining whether there is an increase in current when the thermal interface material is in contact with the two interconnects.

In yet another aspect of the invention, a test methodology comprises placing a quantity of thermal interface material on a device under test. The test methodology further comprises placing a glass slide at a predetermined load on the thermal interface material. The test methodology further comprises determining whether the thermal interface material adequately covers the device under test without running over an edge; and at least one of if the thermal interface material does not adequately cover the device and/or runs over the edge, then clean the glass and the device and reapply a different quantity of the thermal interface material, and repeat the placing the glass and determining steps; and if the thermal interface material adequately covers the device then accept the thermal interface material.

In still yet another aspect of the invention, a test configuration comprises a substrate or card for attaching to a device. The test configuration further comprises a heat sink structured to dissipate heat away from the device. The test configuration further comprises a power supply which powers the device. The test configuration further comprises a plurality of temperature sensors at locations throughout the device under test and which take temperature readings at the locations. The test configuration further comprises a temperature measurement device for determining an evaporation of a thermal interface material between the device under test and the heat sink by sensing a temperature rise above a steady state temperature of one or more of the temperature sensors.

In yet another aspect of the invention, a test configuration comprises a power supply which applies a voltage between interconnects. The test configuration further comprises a current measurement device configured to measure current passing through the interconnects and a thermal interface material which contacts the interconnects. The current measurement device provides an indication of a difference in current between a voltage applied to the interconnects without the thermal interface material and when the thermal interface material is in contact with the interconnects.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to methodologies and test configurations for testing thermal interface materials and, in particular, to methodologies and test configurations for testing thermal interface materials used for testing integrated circuits. The methodologies herein provide improved techniques for determining evaporation of the thermal interface materials (LTI), as well as corrosion caused by using different LTIs.

Figure 1:
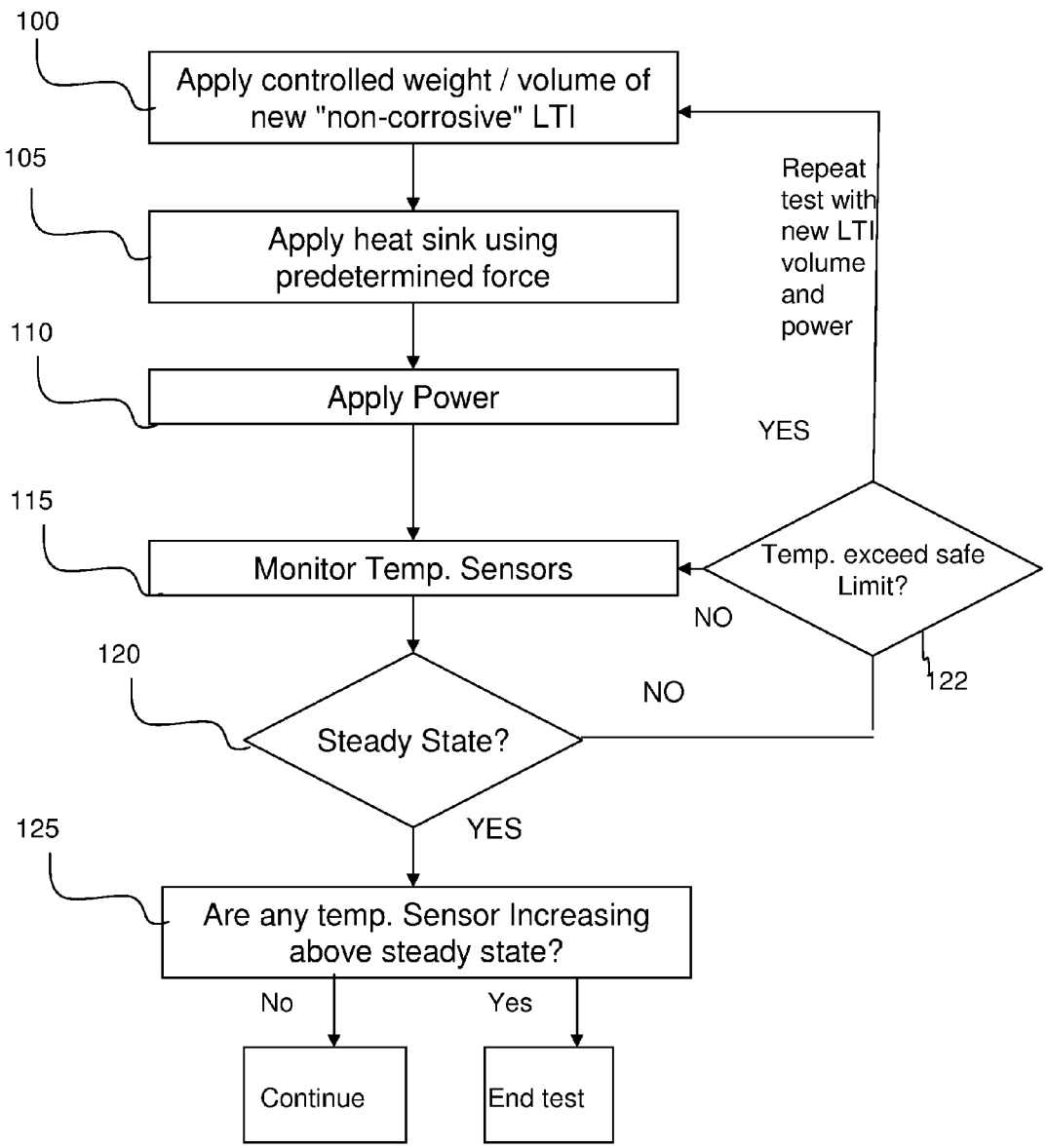
FIG. 1 shows a flow diagram of method for testing thermal interface materials in accordance with aspects of the invention.

FIG. 1 shows a method of testing a device to ensure that a thermal interface material (LTI) will provide adequate heat transfer properties to the device under test. For example, using the test configuration shown in FIGS. 2a-2d, the method of the present invention includes, at step 100, providing a controlled weight and volume of an LTI to the device or heat sink. In embodiments, the weight and volume depends on the tooling attached for the test. The weight or volume for a given device/surface size is calculated or estimated on the chip size, chip and heat sink flatness, chip test temperature and test time. For example, too little weight/volume will not give complete coverage for the entire test; whereas, too much weight/volume will be a waste of material, which may spill out of the active area.

At step 105, a heat sink is applied to the device with a predetermined load, and temperature. The load is provided to adequately make contact between the heat sink and device and thermal interface material. In embodiments, the heat sink load and geometry will be similar to the proposed production manufacturing application. In embodiments, temperature, time and force may be, for example, 115° C. for 60 minutes at 10 lb. It is understood, though, that this is merely one non-limiting example, as other examples are provided herein. At step 110, a known power is applied to the device to heat the device to a temperature, e.g., 115° C. At step 115, the method monitors a plurality of temperature sensors that are integrated into or coupled to the test device (or production device, if available) to determine the temperatures at various locations. The method will assume that the temperature sensors will reach a steady state temperature as discussed, for example, with reference to FIG. 3.

In embodiments, the temperature sensors can be small resistors which are calibrated in an oven by measuring electrical resistance vs temperature. A straight line is fit to the calibration data. During testing of the LTI, temperature is calculated from the measured resistance. Other types of temperature sensors such as diodes can also be used with the present invention.

At step 120, the process determines if the temperature sensors have reached a steady state. If the temperature sensors have not reached a steady state, at step 122, the process determines if any of the temperature sensors exceed a safe limit, e.g., 140° C. depending on the materials of construction of the test device and the specification for product test. If the temperature is exceeding a safe limit, the test is ended and restarted with new conditions of heat sink temperature, LTI volume and/or power. If the temperature does not exceed a safe limit, the process returns to step 115.

If the steady state is achieved at step 120, the process then proceeds to step 125. At step 125, the method notes the time at which a first temperature sensor increases above a steady state as the first evidence of evaporation of the LTI from the device interface. The test ends if the temperature increases above the steady state; whereas, it will continue until the temperature increases above the steady state.

In embodiments, during manufacturing, the method looks for a change in average vs. change in maximum temperature. In embodiments, temperature readings may be made (monitored) before, during and after power is applied to the chip in order to provide comparison and base line data. However, the present invention should not be limited to any specific time periods for temperatures monitored before, during and after power is applied to the chip; although, in embodiments, the test may be run longer than the anticipated product test time, with the time varying from product to product.

Table 1, below, shows examples of weights, loads, wattage, test time and test temperature.

TABLE 1

| Example | Chip Size mm × mm | Chip Power Watt | LTI Weight mg | Load lbf | Test Time min | Test Temp ° C. |
|---|---|---|---|---|---|---|
| 1 | 14.7 × 14.7 | 320 | 2.1 | 12.5 | 60 | 115 |
| 2 | 20.9 × 21.7 | 75-350 | 4.0 | 3.5 | 15 | 85 |

FIGS. 2a-2d show a configuration for implementing a test methodology according to an aspect of the invention. The test methodology using the configuration shown in FIGS. 2a-2d will be used to determine whether a thermal interface material (LTI) can withstand test conditions, e.g., from about 5 to 50 minutes at about 55° C. to about 115° C., without evaporating.

Figure 2A:
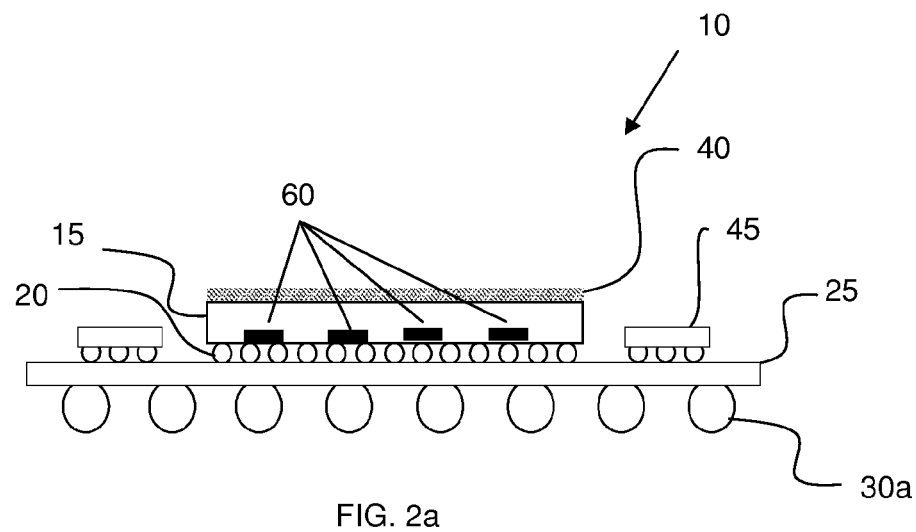
FIG. 2a shows a configuration using temperature sensors to test a thermal interface material in accordance with aspects of the invention.

More specifically, FIG. 2a shows a test chip module with temperature sensors and heaters in accordance with aspects of the invention. The structure 10 includes a primary electronic component (device) 15 that includes interconnects (e.g., C4s) 20 for bonding to any known type of substrate 25 and/or card. The device 15 can be a single component (e.g., chip) or may be a combination of components (e.g., lidded module). In embodiments, the device 15 may or may not be attached on the substrate 25 and/or card that may or may not have secondary electronic components 45 with or without interconnects 30. The test device 15, in embodiments, is to be used to test and evaluate LTI materials. In embodiments the test chip module has a similar size to the production modules that will eventually be tested for performance, yield and/or reliability with the LTI.

The module may also contain an underfill material surrounding the C4 interconnects (not shown) and may be covered with a lid (not shown). In non-limiting embodiments, the device 15 (or chip) can have dimensions 21.3 mm×26.7 mm with C4 interconnects powered up to at least about 340 W. In another illustrative, non-limiting embodiment, the device or chip can have dimensions 23.6 mm×22.0 mm with C4 interconnects powered up to at least about 400 W.

Figure 2B:
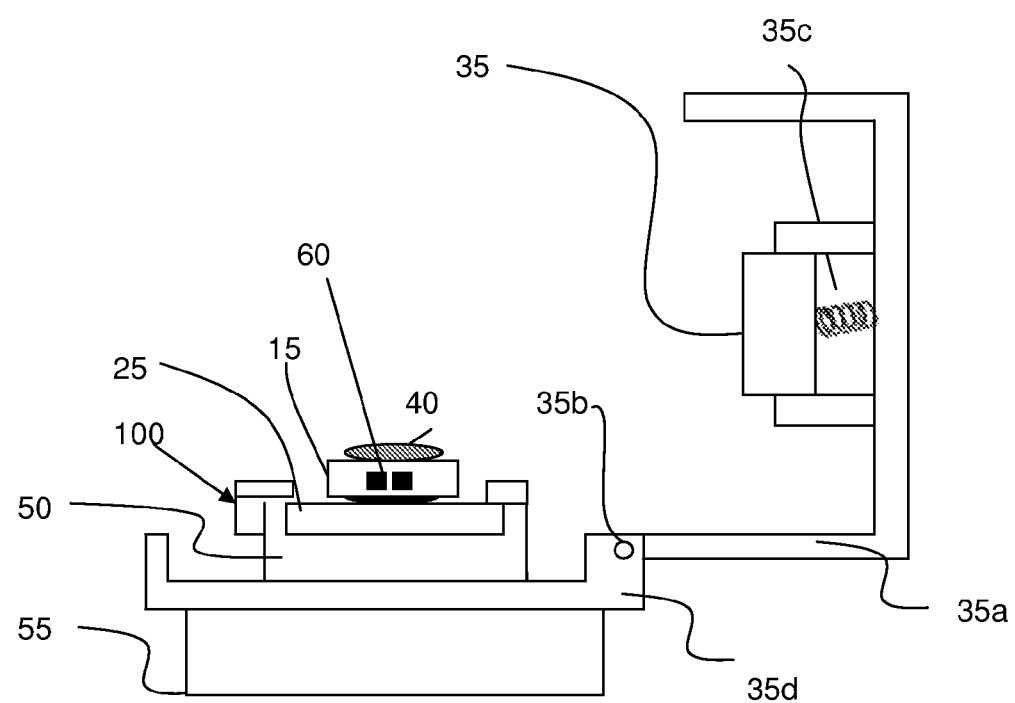
FIG. 2b shows a test socket with a module having temperature sensors, with a heat sink in non-thermal contact with the device in accordance with aspects of the invention.
Figure 2C:
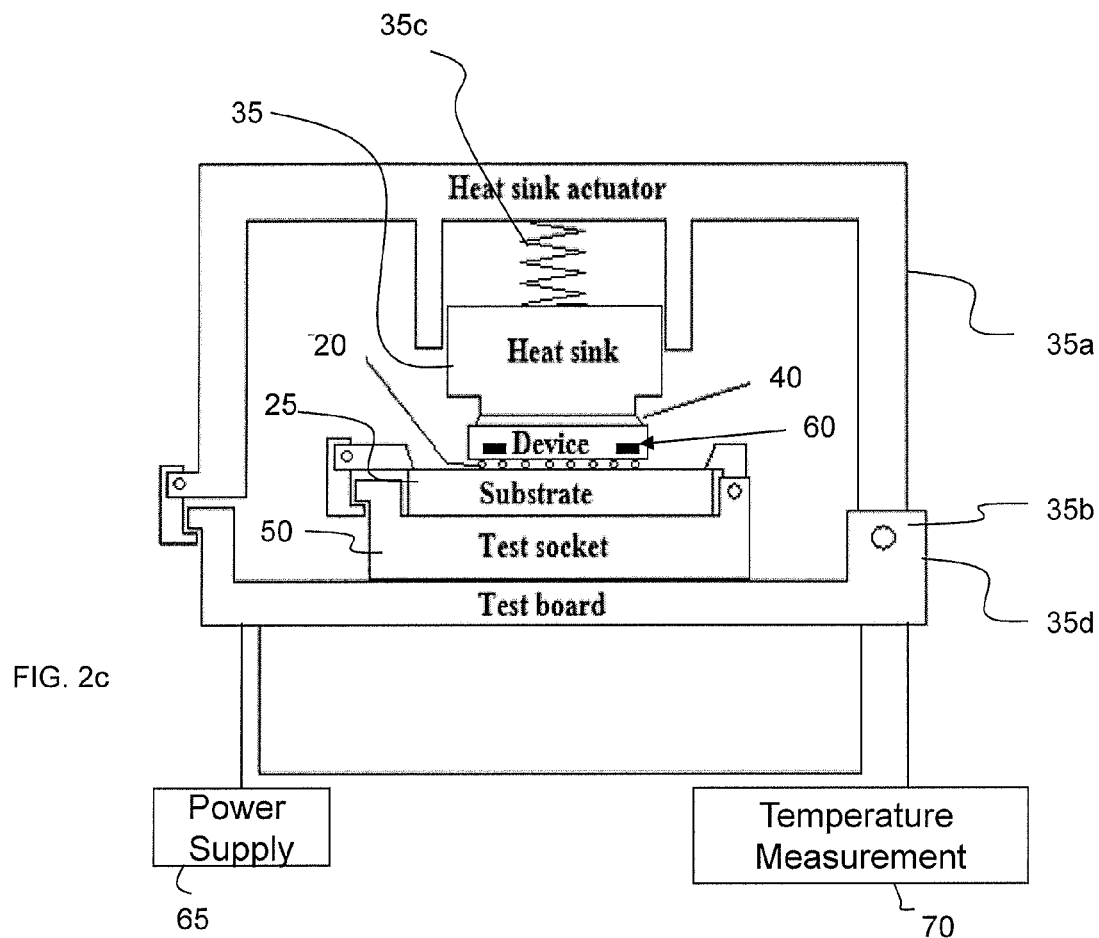
FIG. 2c shows a test socket, where the heat sink is in thermal contact with the module having temperature sensors in accordance with aspects of the invention.

FIG. 2b shows a test socket with the test chip module of FIG. 2a, with a heat sink in non-thermal contact with the device in accordance with aspects of the invention. FIG. 2c shows a test socket, where the heat sink is in thermal contact with the test chip module having temperature sensors in accordance with aspects of the invention. In both FIGS. 2b and 2c, temperature sensors 60 are integrated into or coupled to the device 15 to measure the temperature of the test device, and determine properties of the LTI.

Referring to both FIGS. 2b and 2c, the socket may include a substrate clamping feature 100 and a hinged 35b cover 35a that incorporates a spring 35c loaded heat sink 35. As shown in FIG. 2b, the module is placed into the socket and LTI 40 placed thereon. The cover 35 can then be closed as shown in FIG. 2c. In particular, the socket includes a primary electronic component (device or chip) 15 that includes interconnects (e.g., C4s) 20 for bonding to any known type of substrate 25. The device 15 can be attached to a ceramic substrate 25 having capacitors as secondary electronic components also attached to the substrate 25 with lead tin or lead free interconnects. The device 15 is in thermal contact with a heat sink 35 by an LTI 40, in order to take away (e.g., dissipate) heat from the powered device. The LTI 40 can be in direct contact with both the device 15 and the heat sink 35.

In embodiments, the heat sink 35 may be a water cooled heat-sink with a nickel plated surface to take away heat from the powered device 15. The heat sink 35 may be placed in contact with the device 15 by a heat sink actuator 35a, hinge mounted 35b to a test board 35d. The heat sink actuator 35a may include a spring mechanism 35c to provide a downward pressure on the heat sink 35. The heat sink 35 may include flexible supply tubing or bellows to supply cooling fluid while allowing gimbaling and flexibility (not shown). The heat sink 35 may also include heating elements and temperature sensors to actively control chip temperature. It is understood that FIG. 2c is representative only, there are many other types of sockets, heat sinks and heat sinks actuators well known in the art. It is common that some or all parts of the process are automated. The spring loaded heat sink is forced into direct contact with the device at some small area of contact. There remains a small gap across the rest of the area which is caused by the non flat surfaces and will be affected by the heat sink force. This gap is filled by the LTI.

FIGS. 2b and 2c further show a plurality of temperature sensors 60 integrated into or coupled to the thermal test device 15 (or actual production device, if available). In embodiments, the temperature sensors 60 can be small resistors or diodes (or combination of resistors and diodes). In other embodiments, it is possible to use the actual production device as a thermal test device because modern microprocessor devices often already have multiple temperature sensors. In a test chip, resistors are designed across the chip to result in a uniform or at least known pattern of power dissipation. It should be understood, though, that the pattern of power dissipation across the product device is not as well known as in the test device. When one area of a product device starts to overheat that area will generally start drawing more current from the rest of the chip resulting in an increase in power density which, in turn, increases temperature. This positive feedback can result in localized thermal runaway and damage to the device. Additionally, the production device may not be available in the time frame of the LTI testing.

FIG. 2c shows a power supply 65 and temperature measurement device 70. In embodiments, the power supply 65 provides power levels in excess of 400 watts, which consequently generates a tremendous amount of heat build-up in the device 15. The temperature measurement device 70 is connected to the temperature sensors 60, for determining the temperature across the device 15. In embodiments, the temperature measurement device 70 monitors the temperature sensors 60, to determine a steady state and an increase in temperature of any of the plurality of temperature sensors 60. More specifically, the temperature measurement device 70 is structured and arranged to determine an evaporation of a thermal interface material 40 between the device 15 and heat sink 35 by sensing a temperature rise above a steady state temperature of one or more of the temperature sensors 60. The temperature measurement device 70 can alert the user of these different states by use of, for example, an alarm, display or other user interface.

Figure 2D:
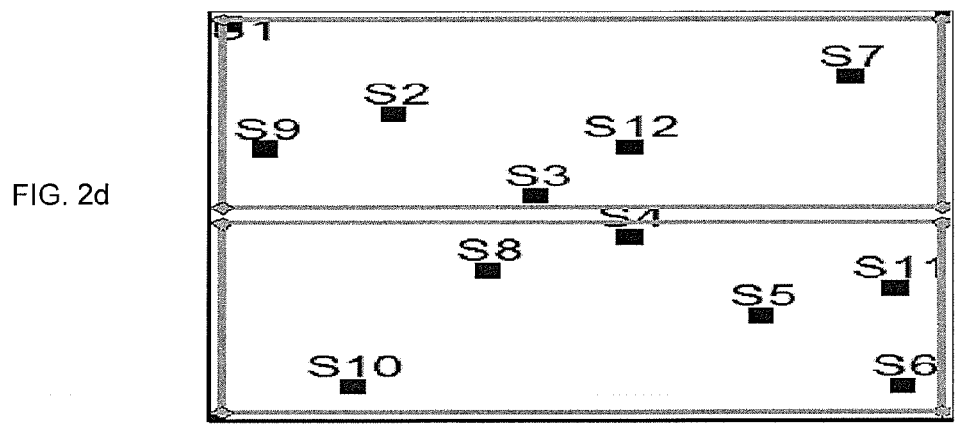
FIG. 2d shows a plurality of temperature sensors in accordance with aspects of the invention.

The temperature sensors 60 can be provided in a predetermined pattern on the device as shown, for example, in FIG. 2d. More specifically, in FIG. 2d, the temperature sensors S1-S12 are embedded in the device (or coupled to the device) in order to obtain various temperature readings. In embodiments, the temperature sensors can be located at many different locations, all at known locations for measuring the temperature of the device under test. For example, one contemplated configuration would be to place a temperature sensor in each corner and one in the center for a minimum of five (5) temperature sensors. Also, although 12 temperature sensors are shown in FIG. 2d, it is well understood that more than 12 temperature sensors are advantageous because small areas of a chip may start to dry out before any temperature effect is seen on distant sensors. In another contemplated configuration, 27 temperature sensors were used to measure a temperature at various locations on the chip.

In embodiments, the test device is installed in the test socket, LTI fluid of known volume is applied and it is contacted by the heat sink in a manner for the production of devices. The test device is connected to the power supply 65 which supplies a known voltage and current. The power in watts is the product of the measured voltage and current. The power supply 65 can include a current measurement device configured to measure current passing through the interconnects and a thermal interface material which contacts the interconnects. In embodiments, the current measurement device provides an indication of a difference in current between a voltage applied to the interconnects without the thermal interface material and when the thermal interface material is in contact with the interconnects.

The temperatures are monitored before, during and after power is applied to the chip using the temperature measurement device 70, connected to the temperature sensors 60. As previously noted, the present invention should not be limited to any specific time periods for temperatures monitored before, during and after power is applied to the chip.

If the device is known from its design to have a uniform power across its area, it is expected to see a fairly uniform temperature gradient across the device. The temperatures should quickly settle in at a steady state value for as long as constant power is applied. Steady state is a temperature increase over time that is inconsequential to the expected product test results. As a practical example, a temperature increase of less then 1° C. in 60 seconds may be considered steady state. The steady state temperature increase is often divided by the power to obtain a thermal characterization parameter that is typically referred to as a thermal resistance; units are C/W or may be further normalized by the device surface area as C sq cm/W. This calculation may be performed for each temperature sensor as well as the average of all temperature sensors. In this methodology, if one corner (or other location) becomes hotter than the others, it can be deduced that there is insufficient LTI at that corner (or other location). Other possibilities that would be investigated are a non-flat heat sink or non uniform heat sink force. After the steady state thermal resistance is determined the test is continued to see if and at what time there will be some evidence of evaporation.

Figure 3:
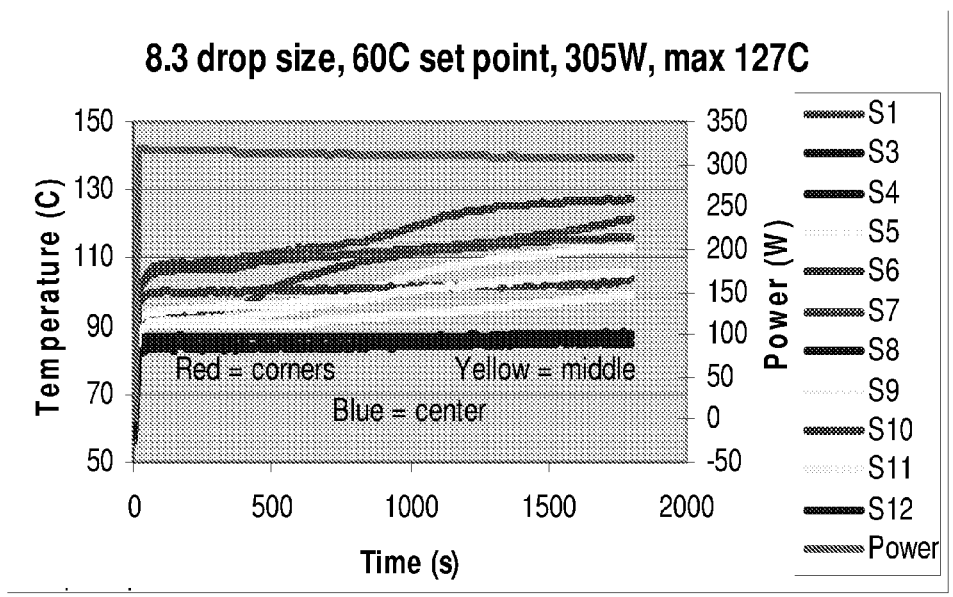
FIG. 3 shows a temperature performance graph of a known thermal interface material obtained using the methods of the present invention.

Typical results using the methodologies and configuration described herein are shown in FIGS. 3-6c and 6e. FIG. 3 shows results of a known thermal interface material mixture of water and propylene glycol tested between a 19 mm×20 mm chip and a liquid cooled heat sink with a cooling fluid temperature of 60° C. The heat sink force was 44 lb. At time=0, the power is off and the device is at the cooling fluid temperature, and when the power is turned on the chip heats up. In this test, there are 11 temperature sensors across the chip. As shown, the temperatures reach a steady state temperature (as indicated by the horizontal lines) within about 30 seconds of applying power. This steady state remains for about 300 seconds when one corner sensors start increasing in temperature; most of the other temperature sensors remain at this steady state temperature for the duration of the test. Other sensors start to increase within about 400 seconds of when power is applied, indicating that the fluid in the area of those temperature sensors has dissipated. Accordingly, using the test configuration of the present invention, it has been found that an increase in temperature is due to fluid evaporation from between the chip and heat sink. This would be considered an acceptable test only up to about 300 seconds. This test may have some variability each time it is run. In embodiments, the present invention contemplates applying a factor of safety to such measured data when using the measured data to develop a highly reliable process.

Figure 4:
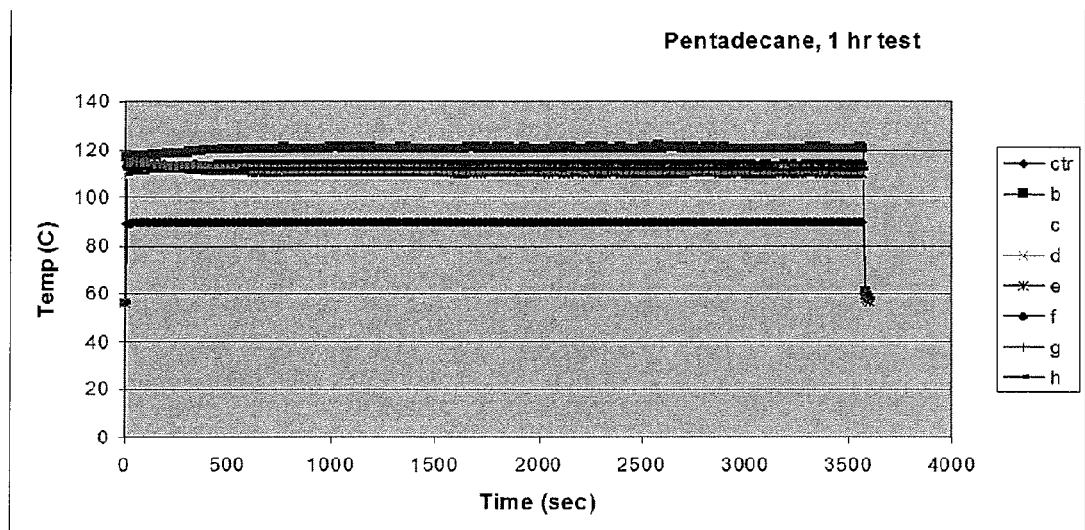
FIG. 4 shows a temperature performance graph of a thermal interface material under a temperature test for 1 hour, obtained using the methods of the present invention.

FIG. 4 shows a temperature performance graph of an improved thermal interface material (e.g., Pentadecane) under a temperature test for 1 hour, in accordance with aspects of the invention. More specifically, FIG. 4 shows a temperature test for Pentadecane ($C_{15}H_{32}$) as measured at several locations along a device under test. These locations are represented by "ctr" (center) and "b" through "h", which are positions of temperature sensors along a device under test. This graph shows that Pentadecane was able to withstand temperatures of about 115° C. for about an hour, without evaporating. This is shown by the steady state (e.g., constant) lines in the graphs, compared to the profile of FIG. 3. The test was ended after 1 hour because that is about 3 times longer than the expected production test time. The 3× factor of safety will ensure a highly reliable manufacturing process.

Figure 5:
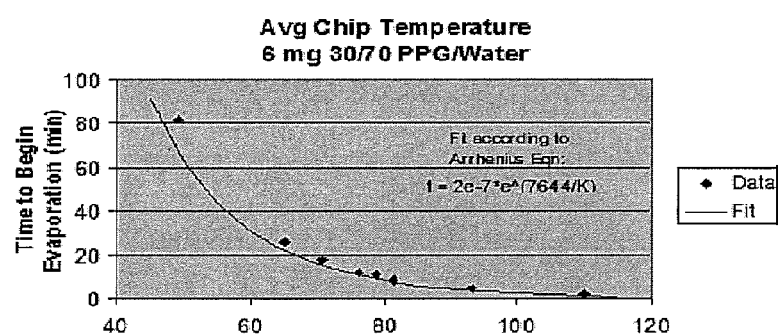
FIG. 5 is a graph showing data from running a test methodology numerous times at different chip temperatures obtained using the methods of the present invention.

The data shown in FIG. 5 is from running the test methodology numerous times at different chip temperatures. The time to begin evaporation is when any temperature sensor first starts to increase above the steady state temperature. This plot predicts the maximum "safe" test time for a given type and volume of LTI. The shape of the curve will also be dependent on other factors such as chip size and heat sink flatness.

Figure 6A:
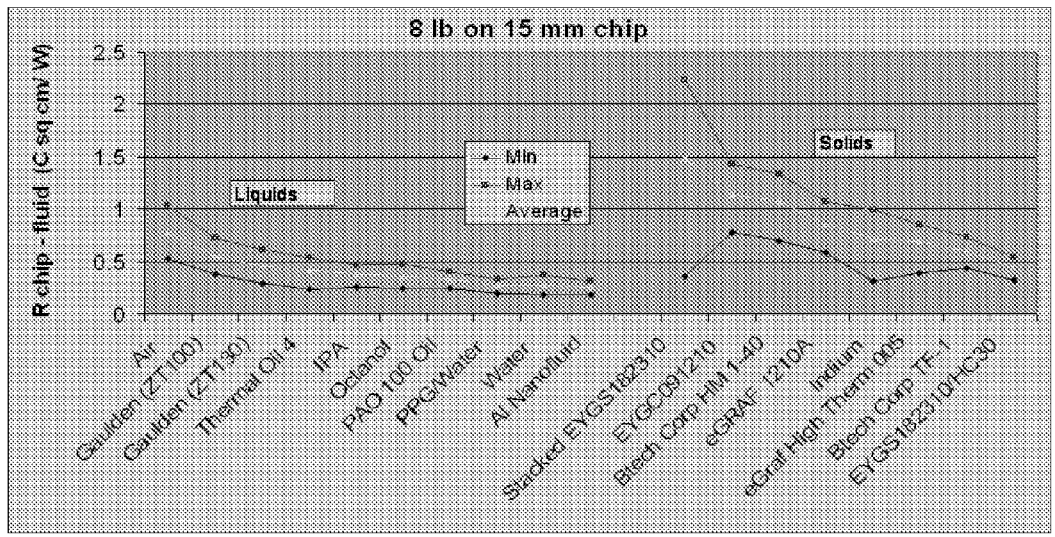
FIGS. 6a and 6b show temperature performance data of different thermal interface materials at several different temperature sensor positions along the device obtained using the methods of the present invention.
Figure 6B:
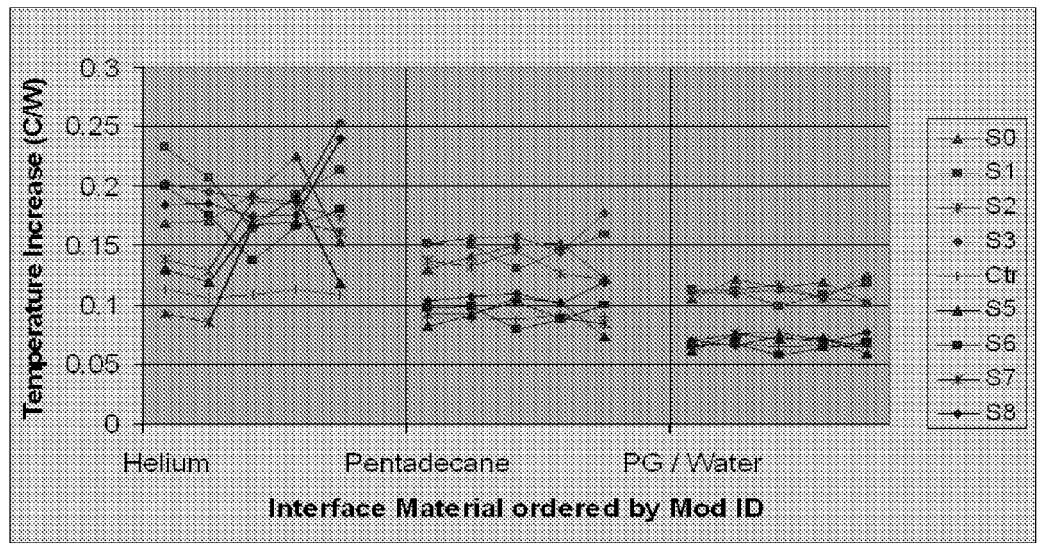

FIG. 6a is an example of results done for a large number of TIM and LTI candidates measured with one test chip, heat sink and force. It should be understood by those of skill in the art that results will be different with other test chips, heat sinks or forces. Plotted are results from the hottest, coolest and average sensors. FIG. 6b shows thermal resistance data obtained from testing 5 different product chips each with three (3) different TIM materials. At one point in the test program the power and temperatures are measured. As expected the temperature sensors in core processor areas are hotter than sensors in other areas of the chip. As shown in the graph, helium provides non-acceptable thermal properties. It is also known that helium needs constant replenishment or a very well sealed test chamber, as it will dissipate during test. Water (e.g., PG/water), on the other hand, is shown to have good thermal properties. Pentedecane provides good thermal properties, and will not evaporate during test.

Figure 6C:
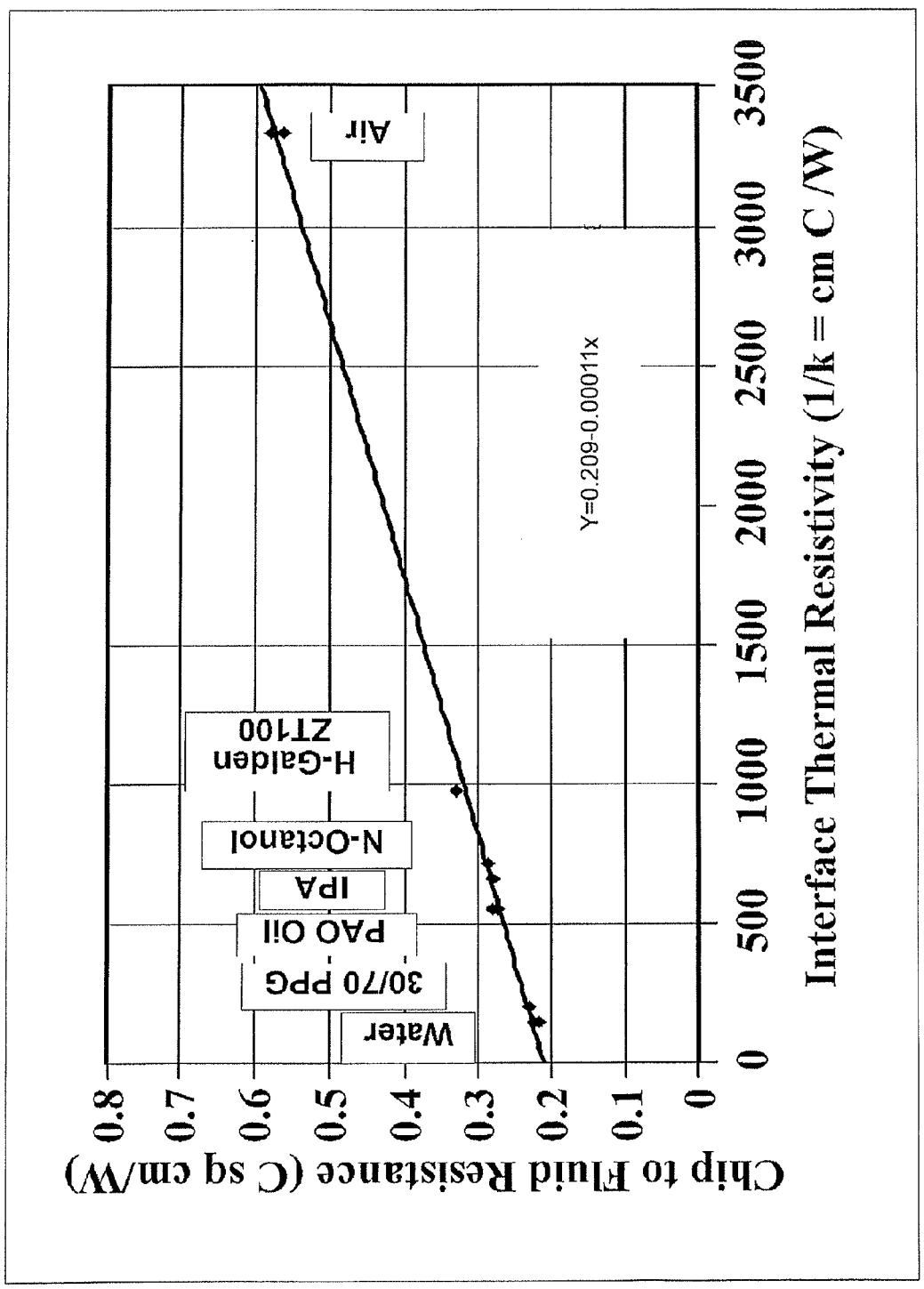
FIG. 6c shows temperature performance data of different thermal interface materials as a function of the material thermal conductivity obtained using the methods of the present invention.

FIG. 6c shows the results of several tests of different LTI materials using the same test chip, heat sink and force. Normalized average thermal resistance (C sq cm/W) is plotted vs the interface resistivity (which is inverse thermal conductivity) in units of C sq cm /W. The data is linear. A simple thermal model predicts that the slope of the line is the average LTI gap thickness of 0.00011cm or 1.1 microns. The y intercept is a prediction of overall heat sink performance with a perfect interface material (infinite thermal conductivity). This type of chart can be used to predict performance of other LTI materials if their thermal conductivity is known or to estimate their thermal conductivity if resistance is known. Helium was found to have worse thermal performance than predicted from this chart because the mean free path approaches the gap size, thus effective thermal conductivity of helium in these small gaps is about 2× lower than bulk published values. This method of analyzing the data also provides a way to estimate the effect of heat sink and device flatness on thermal performance.

Figure 6D:
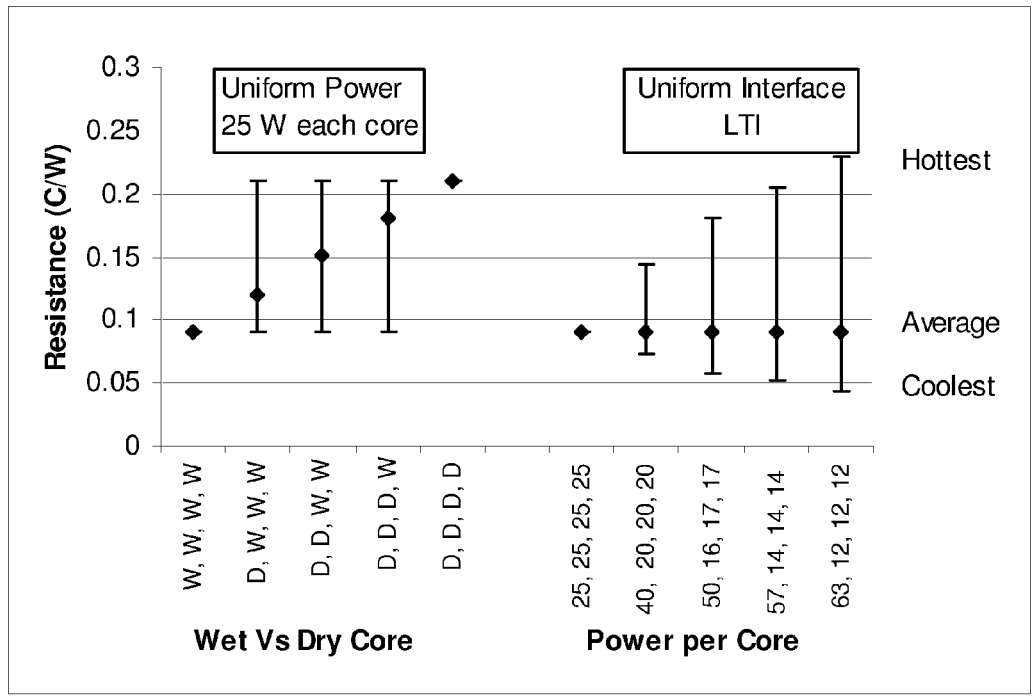
FIG. 6d shows the result of a simple model predicting temperature gradients on a product module that may have variable LTI coverage and power.

FIG. 6d shows the result of a calculation that assumes each quadrant of an idealized chip is independently powered and cooled. Resistance is based on the total power and temperature rise of the hottest, coolest and average sensor. The first five cases assume uniform power in each quadrant. The first case has uniform LTI, as expected the temperature is uniform at 0.09 C/W. In case 2, LTI is removed from one quadrant and its temperature increased to 0.21 C/W. As LTI is removed from the other quadrants, the temperature of those quadrants increases to 0.21 C/W thus increasing the average temperature. The second of the five cases assume uniform LTI coverage and a total chip power of 100 watts. The first of these cases has 25 watts on each core. The next case has 40 watts in one core and 20 watts in each of the other cores resulting in an increased temperature of the 40 watt core. However, the average temperature remains the same. The same trend is seen as the power becomes more and more non uniform. It is known that production chips can occasionally have manufacturing defects where one core draws more power than the others.

Figure 6E:
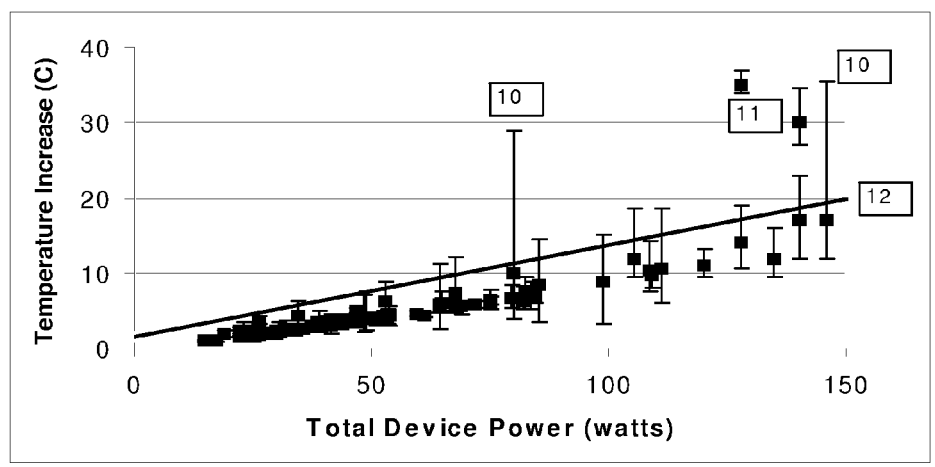
FIG. 6e shows thermal data measured on production modules.

FIG. 6e shows data measured on production modules at one point in module test. The device has 9 temperature sensors. The maximum, average and minimum temperature increase is plotted versus total module power for each device (shown as a box with error bars). There is a large variation in chip power for these modules but the average sensor data in general follows a linear trend. An action limit based on average is shown (12). The action limit is 1.5 C at zero power due to the accuracy of the temperature sensors. Modules with an average above the action limit (11) were tested without LTI due to a tool malfunction. Modules 10 have good LTI but are defective chips that allow one core to draw excessive power. This data analysis method suggested by the model of FIG. 6d can be used to determine if a production device suffers from non uniform LTI (resulting in an increase in average temperature) or non uniform power (resulting in acceptable average but increase in maximum temperature). Alternately, if the power of each core is known, thermal resistance can be based on the temperature rise of each core divided by the core power resulting in an improved measure of the presence of LTI.

Figure 7A:
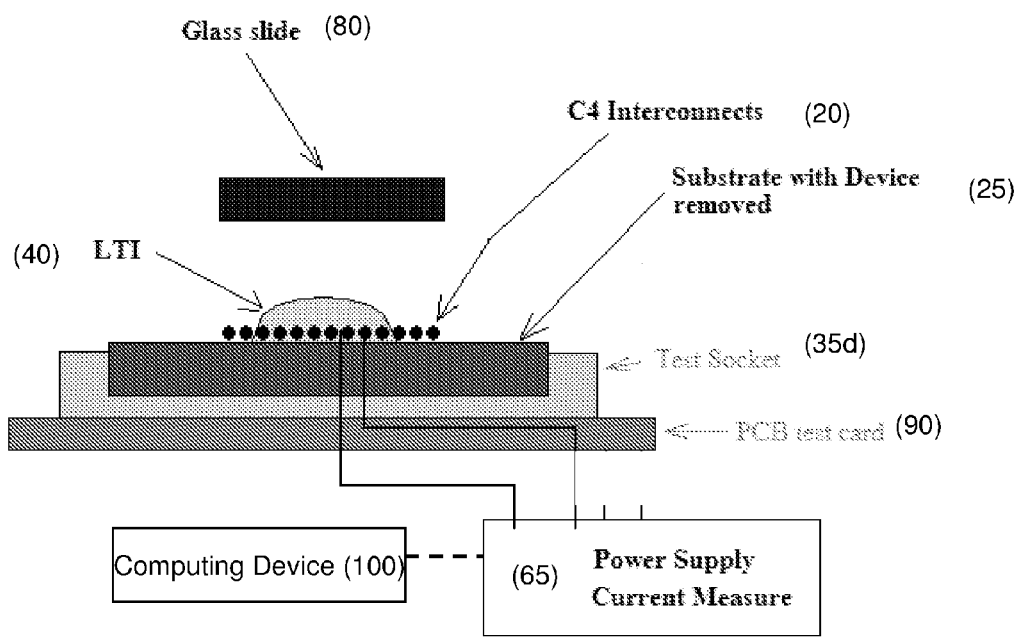
FIGS. 7a and 7b show alternative test configurations to measure conductivity (and observe thermal interface material) in accordance with an additional aspect of the invention.

FIG. 7a shows a test configuration in accordance with an additional aspect of the invention. The method using the configuration of FIG. 7a can measure conductivity of the LTI under conditions close to what will be used when testing product with LTI in the unlikely scenario where some of the LTI runs over the chip and gets into the area of the interconnects. In other words, conductivity is measured between adjacent interconnects. Ideally the interconnects are the same alloy, size and spacing as the interconnects used in the product, as an example 0.005" diameter solder balls 97% lead, 3% tin spaced 0.009" apart. The advantage of the method of FIG. 7a is to be able to observe corrosion or electromigration dendritic growth between the interconnects in the presence of LTI.

In the test configuration of FIG. 7a, a substrate 25 with solder balls (interconnects) 20 is covered with a glass slide 80. (In embodiments, the device may also be mounted to the substrate 25, however, this will not allow viewing of the interconnects or the movement of LTI among the interconnects when LTI is introduced.) The substrate 25 is placed within a test socket 35b, which may be mounted to a PCB test card 90. Voltage potential is provided between two or more interconnects 20 by the power supply 65. The current is monitored, and an LTI fluid candidate 40 is introduced into the area at the edge of the glass slide 80 where it will typically wick under the glass slide 80 and wet the interconnects 20. It should be noted that the LTI fluid candidate 40 may be provided on the substrate 25, prior to applying the glass slide 80 or providing the current as shown in FIG. 7a. In embodiments, the method can verify a low initial current flow, apply a drop of LTI sufficient to cover (between or in contact) the at least two interconnects 20, and record current vs. time. An increase in the current indicates an unacceptable LTI candidate. Also, observation of corrosion through the glass slide 80 indicates an unacceptable candidate, as discussed in more detail below. The results can be sent to a computing device 100 for storage and future retrieval and/or analysis.

For unacceptable candidates, the current may continue to increase over time due, possibly, to one or more phenomenon. For example, the LTI may become more conductive in the presence of air or due to contamination on the interconnects 20 or device. Alternatively, or in addition, the conductive metal dendrites may grow between adjacent interconnects 20, effectively creating a short circuit. It has also been observed conductivity may increase and decrease over time, which may be due to dislocation of the dendrites, dry out of the LTI and evolution of gas, e.g., Hydrogen will be released from water in the presence of sufficient voltage.

Figure 7B:
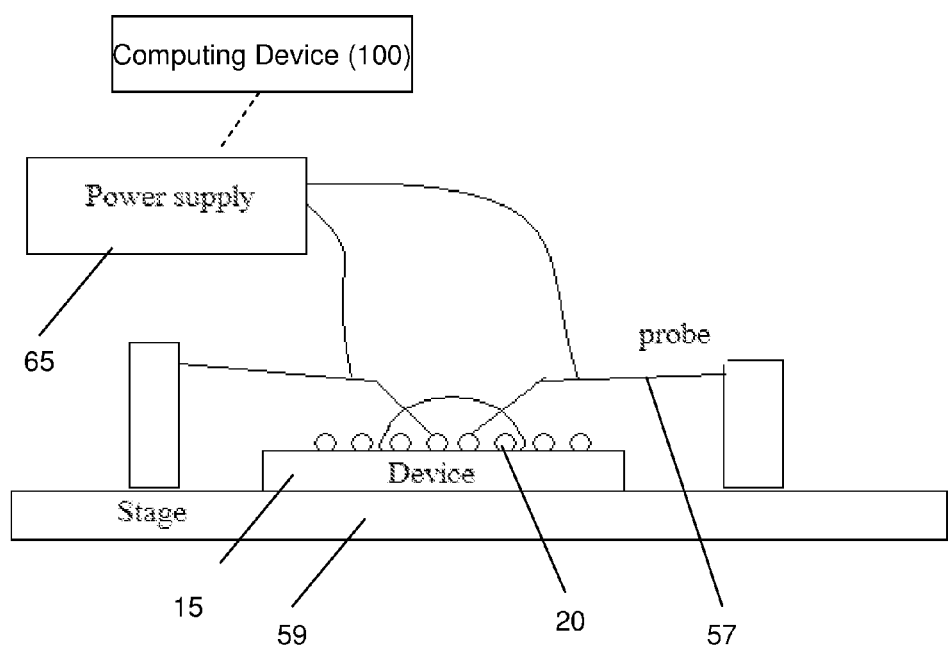

FIG. 7b shows an alternate embodiment where the device 15 is placed on a stage 59, and two adjacent interconnects 20 are contacted by electrical probes 57. The probes 57 are connected to a power supply 65, and current is measured. It should be understood that this embodiment may not use a glass slide, even though direct observation is not quite as clear without the glass slide 80. By way of an example, one probe can be connected to a ground interconnect, while a second probe can be connected to an I/O interconnect. In embodiments, the probes can be connected to other solder connections, such as, for example, dummy C4s (solder connections). Once the probes are applied, the power source can apply about 1V-3V. In this example, about 3 μl of solvent (LTI) can be applied to the device. The device can be monitored with a parameter analyzer such as, for example, an HP 4145B Parameter Analyzer (manufactured by Hewlett Packard™). In embodiments, the HP 4145B Parameter Analyzer can take about 1000 data points/scans, where a single scan is about 55 seconds. In embodiments, a "medium" scan is about 73 seconds (each point average of 16 measurements) and "long" scan is about 323 seconds (each point average of 256 measurements). The results of the scans can be sent to a computing device 100 for storage and future retrieval and/or analysis.

The computing device 100, as should be understood by those of skill in the art can include an operating system, a processor, ROM, RAM and permanent storage such as, for example, an internal hard drive or an external storage such as, for example, a CD ROM, magnetic storage, optical storage of the like. More specifically, the computing device 100 includes a processor, memory, an I/O interface, and a bus. The memory can include local memory employed during actual execution of program code, bulk storage, and cache memories. In addition, the computing device 100 includes random access memory (RAM), a read-only memory (ROM), and an operating system (O/S). The computing device 100 is in communication with the external I/O device/resource and storage system. The processor executes computer program code (e.g., program control), which can be stored in the memory and/or storage system. While executing the computer program code, the processor can read and/or write data to/from memory, storage system, and/or I/O interface. The bus provides a communications link between each of the components in the computing device. The functionality provided by the computing device 100 can be implemented by a computing article of manufacture that includes any combination of general and/or specific purpose hardware and/or computer program code. In each embodiment, the program code and hardware can be created using standard programming and engineering techniques, respectively.

Figure 8:
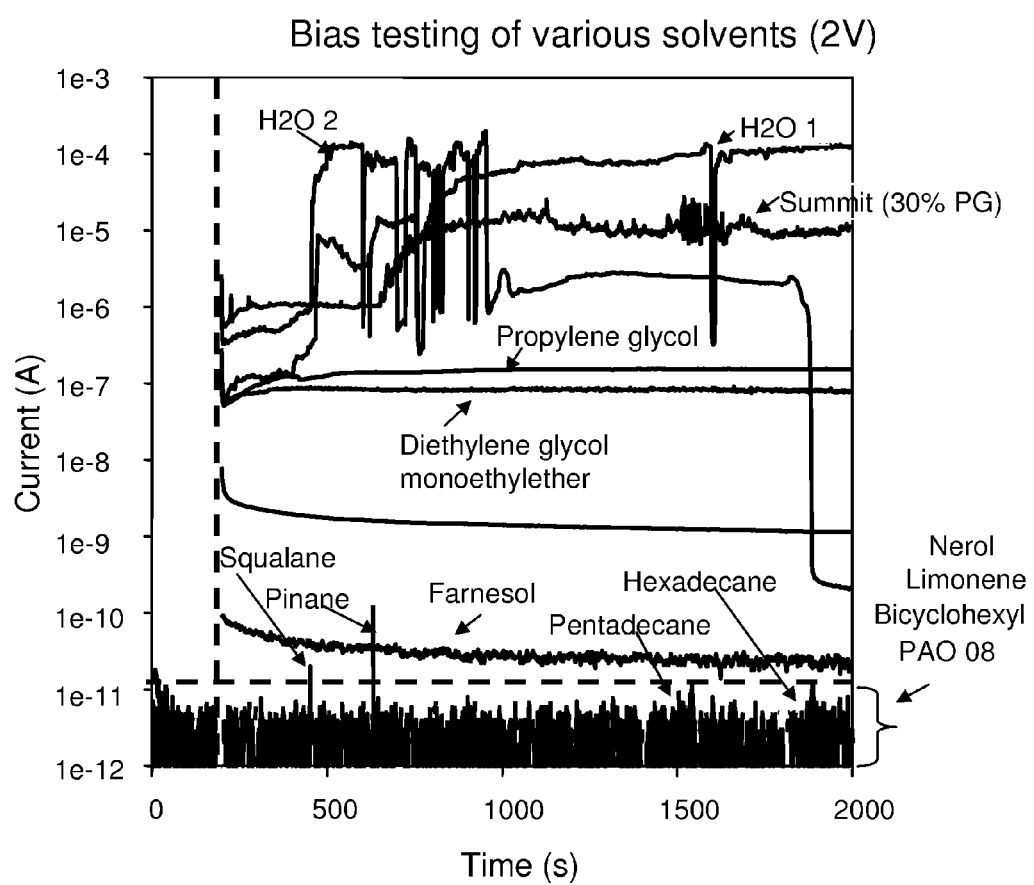
FIG. 8 shows a graph representative of a corrosion test (current vs. time) for various thermal interface materials in accordance with aspect of the invention.

FIG. 8 shows a graph representative of a corrosion test (current vs. time) for various thermal interface materials in accordance with aspect of the invention. More specifically, FIG. 8 shows a graph of data for a corrosion test (current vs.

time) for various solvents, including Pentadecane ($C_{15}H_{32}$) and Hexadecane ($C_{16}H_{34}$) in accordance with aspects of the invention. This test shows Pentadecane and Hexadecane are non-corrosive materials to the C4, as well as exhibit good electrically insulating properties.

Other materials that exhibit good thermal properties without causing corrosion include, for example, Nerol, Limonene, Pinane and Squalene. These materials may, however, evaporate during the test and/or leave residue on the device under test. For example, as discussed below, Nerol may leave a residue on the device under test, which would require cleaning with solvent. It has been discovered from this test procedure that all materials that had oxygen showed varying amounts of current flow and corrosion. Surprisingly, materials that did not contain oxygen did not allow current flow and had no sign of C4 corrosion.

Figure 9A:
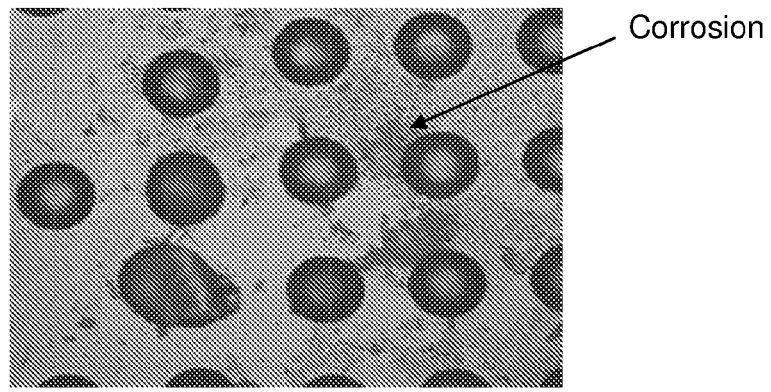
FIGS. 9a-9c show representative devices that used thermal interface materials during testing, in accordance with aspects of the invention.
Figure 9B:
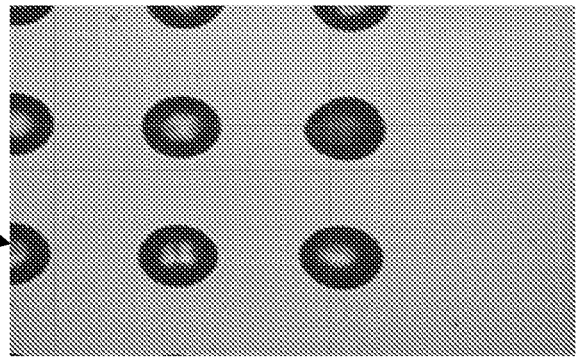
Figure 9C:
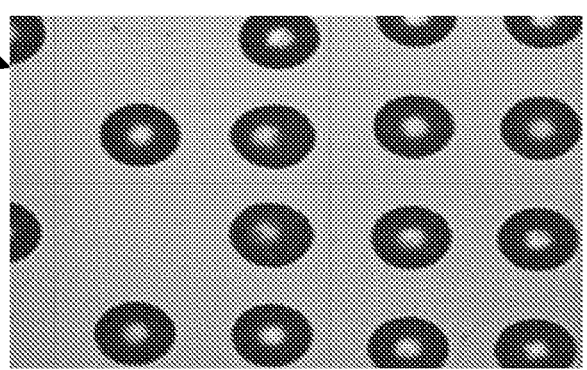

FIG. 9a shows corrosion residue left after testing a device with water based LTI after some LTI came into contact with the chip C4s during electrical test. FIGS. 9b and 9c show devices using Pentadecane 15a and Hexadecane 15b, respectively, that do not exhibit any residue on or around the chip C4s after testing.

Figure 9D:
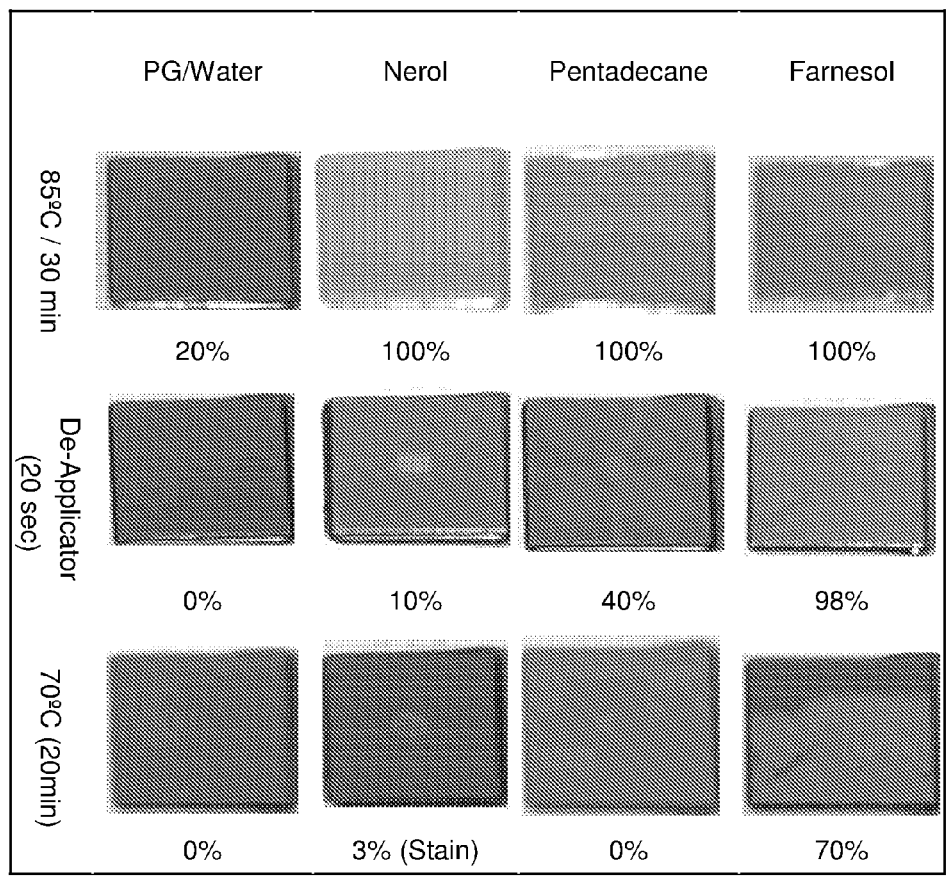
FIG. 9d shows chip surfaces at different phases of testing.

FIG. 9d shows chip surfaces at different phases of testing with different thermal interface materials, including Pentadecane in accordance with aspects of the invention. The testing with the interface material disposed between (in contact with) the chip and heat sink is for 30 min at 85° C. More specifically, FIG. 9d shows data for four thermal interface materials (PG (Propylene Glycol)/water (more specifically, 30% PG+70% De-ionized water), Nerol, Pentadecane and Farnesol). After 30 minutes at 85° C., the heat sink is removed and all chips except that with PG/Water are 100% covered by the thermal interface materials. The excess thermal interface material is removed by suction in a de-applicator and then the parts were baked uncovered in an oven for 20 minutes at 70° C. The exposed fluid evaporates much quicker than when it was covered by the heat sink.

Pentadecane shows many advantages over the remaining materials, one of which is no staining after the uncovered baking in an oven for 20 minutes at 70° C. This is in comparison to PG/Water, Nerol and Farnesol, each of which present issues at the same temperature. For example, as shown by the data of FIG. 8d, Nerol leaves a 3% stain; whereas, Farnesol leaves a 70% residue at 70° C.

Figure 10A:
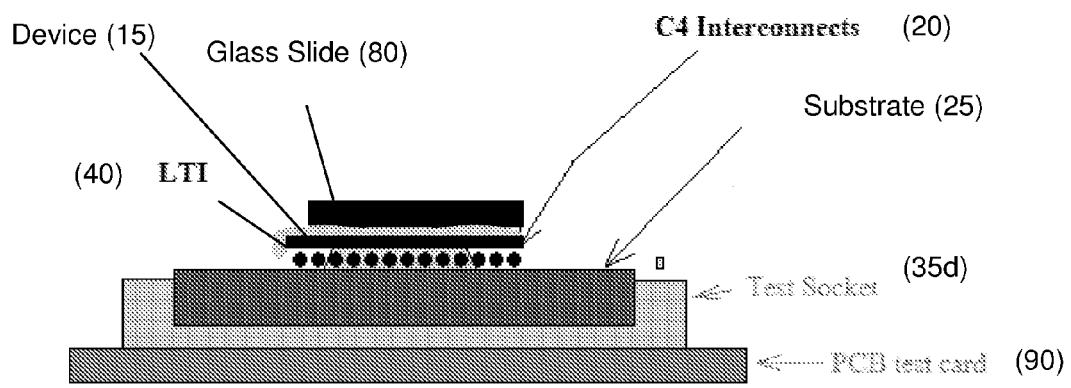
FIGS. 10a and 10b show a test configuration to observe thermal interface material on a surface of the device in accordance with an additional aspect of the invention.
Figure 10B:
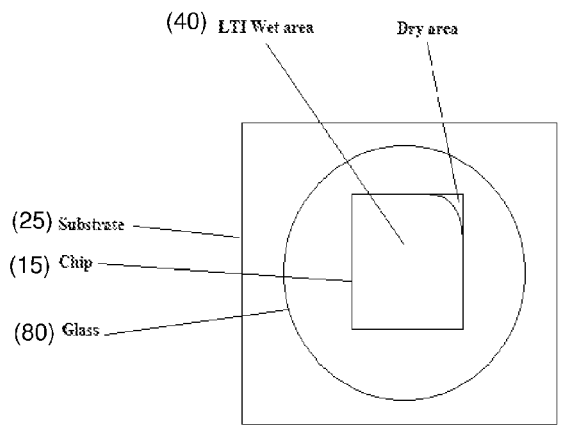

FIGS. 10a and 10b show a test configuration to observe LTI on the surface of the device in accordance with an additional aspect of the invention. In the test configuration of FIGS. 10a and 10b, a device (chip) 15 is mounted to a substrate 25 and placed within a test socket 35b, which may be mounted to a PCB test card 90. An LTI 40 is dispensed onto the device 15, and covered with a glass slide (plate) 80 to disperse the fluid across the surface of the device. The glass slide 80 is ideally optical quality and of same dimensions and flatness as the heat sink. Alternately, a common optical flat can be used. Alternately the test may be done without the test socket and PCB card.

In embodiments, the LTI 40 is placed on the device 15 and the glass slide 80 is contacted to the device 15 in the same manner and force as the heat sink, for example. In one example, the force of the glass slide on the device may depend on the design of the test equipment. For example, a force can range from about 4 to 45 psi, and more specifically about 10 psi. Looking down through the glass slide 80 will allow an observer to determine (view) the extent of the LTI coverage on the device 15. With some types of LTI, it is common to see the fluid coverage change over time as the fluid migrates across the interface between the device and glass slide 80.

It should be understood that FIGS. 10a and 10b are not to scale, and the actual thickness of the LTI 40 is variable across the chip and is determined by the fluid properties, the flatness of the glass slide 80 and device 15, and the force with which they are pushed together. Actual maximum LTI thickness is typically on the order of 10 microns for a bare die and about 50 microns for lidded devices. FIG. 10a shows an unacceptable coverage of the LTI 40. For example, in this case the LTI 40 has not covered the entire chip on the right side and is in danger of running down the left side. FIG. 10b shows a top view of the test configuration with an unacceptable coverage. In this view, it is observed that the LTI does not cover the corner of the chip.

Figure 11:
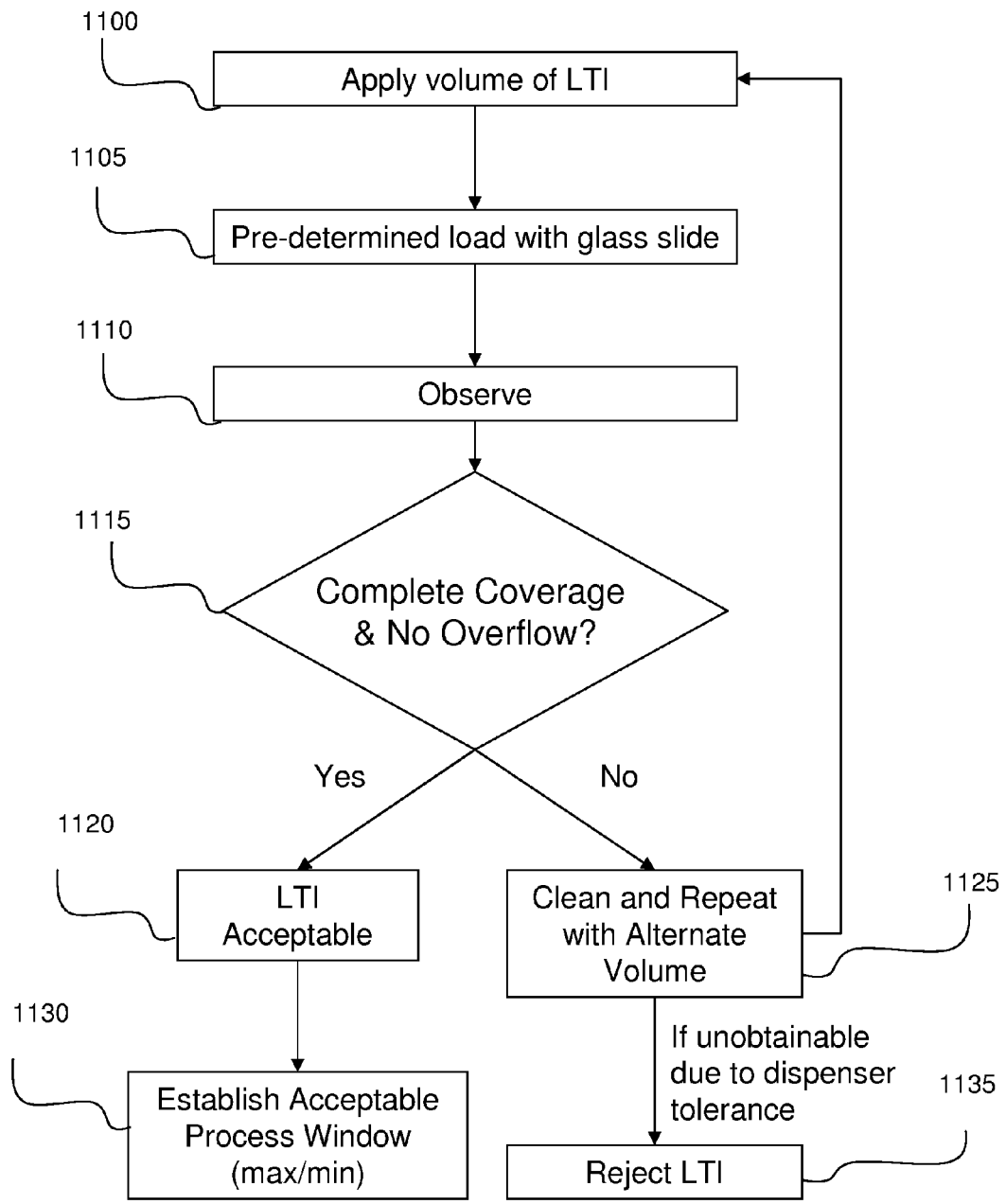
FIG. 11 shows a flow diagram of a method for testing thermal interface materials in accordance with aspects of the invention.

FIG. 11 shows a method of determining whether a quantity of LTI is sufficient to cover the device under test. The method of FIG. 11 can use the test configuration of FIGS. 10a and 10b, for example. At step 1100, a drop of known size of LTI is placed on the device. At step 1105, a glass slide is placed over the LTI and compressed with the same force as the test heat sink, for example. At step 1110 and 1115, it is observed (determined) whether the LTI fully covers the device and does not overflow. If satisfied, at step 1120, the LTI is accepted, and at step 1130, the process establishes an acceptable process window. If the process window determined in step 1130 is small relative to the accuracy of the dispense tool, the LTI is rejected. The accuracy of the dispense tool may be on the order of 0.2 mg. If step 1115 is not satisfied, the glass and device are cleaned and the process is repeated with an alternate volume at step 1125. If dispenser tolerance is such that complete coverage cannot be obtained without overflow, the LTI is rejected at step 1135.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A test configuration, comprising:
    a substrate or card for attaching to a device under test;
    a heat sink structured to dissipate heat away from the device under test;
    a power supply which powers the device under test;
    a plurality of temperature sensors at locations throughout the device under test and which take temperature readings at the locations; and temperature measurement device to determine an evaporation of a thermal interface material between the device under test and the heat sink by sensing a temperature rise above a steady state temperature of one or more of the temperature sensors.

2. The test configuration of claim 1, wherein the plurality of temperature sensors are resistors or diodes or a combination of resistors and diodes.

3. The test configuration of claim 1, wherein the device under test is a thermal test chip.

4. The test configuration of claim 1, wherein the plurality of temperature sensors are positioned at each corner of the device under test and at a central location of the device under test.

5. The test configuration of claim 1, further comprising a thermal interface material on the device under test.

6. The test configuration of claim 1, wherein the temperature measurement device recognizes a time at which a first temperature sensor increases above the steady state as first evidence of the evaporation of the thermal interface material from an interface between the device under test and the heatsink.

7. The test configuration of claim 1, wherein the temperature measurement device makes temperature readings before, during and after power is applied to the device under test in order to provide comparison and base line data.

8. The test configuration of claim 1, wherein the heat sink is in non-thermal contact with the device under test.

9. The test configuration of claim 1, further comprising a test socket for holding the device under test, wherein the heat sink is in thermal contact with the device under test.

10. The test configuration of claim 9, wherein the test socket includes a substrate clamp, and a hinged cover that incorporates a spring loaded heat sink.

11. The test configuration of claim 10, wherein the device under test is placed in the test socket and the thermal interface material is provided in direct contact with the device under test and the heat sink.

12. The test configuration of claim 11, wherein the heat sink is a water cooled heat sink with a nickel plated surface to take away heat from the device under test.

13. The test configuration of claim 12, wherein the heat sink includes a spring mechanism to provide a downward pressure on the heat sink.

14. The test configuration of claim 1, wherein the power supply provides power levels in excess of 400 watts, which generates a heat build-up in the device under test.

15. The test configuration of claim 1, wherein the temperature measurement device alerts a user of different temperature states by use of one of an alarm and display.

* * * * *